(12) United States Patent
Chang et al.

(10) Patent No.: US 6,589,356 B1
(45) Date of Patent: Jul. 8, 2003

(54) METHOD FOR CLEANING A SILICON-BASED SUBSTRATE WITHOUT NH₄OH VAPOR DAMAGE

(75) Inventors: Juin-Jie Chang, Wan-Chiu Village (TW); Jih-Churng Twu, Chung-Ho (TW); Rong-Hui Kao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 204 days.

(21) Appl. No.: 09/676,746

(22) Filed: Sep. 29, 2000

(51) Int. Cl.⁷ .................................................. C23G 1/02
(52) U.S. Cl. ............................... 134/3; 134/1; 134/1.3; 134/2; 134/21; 134/25.4; 134/32; 436/694; 436/695
(58) Field of Search ........................... 134/1, 1.3, 2, 21, 134/25.4, 32, 36, 42, 902, 3; 438/694, 695, 703, 745, 749

(56) References Cited

U.S. PATENT DOCUMENTS 5,498,293 A * 3/1996 Ilardi et al. ................. 134/2
5,560,857 A * 10/1996 Sakon et al. ................. 134/3
5,656,097 A * 8/1997 Olesen et al. ................. 134/1
5,964,953 A * 10/1999 Mettifogo ................. 134/1.3
5,989,353 A * 11/1999 Skee et al. ................. 134/2

OTHER PUBLICATIONS http://snf.stanford.edu/Process/Characterization/NativeOx.html—Date not available.*

* cited by examiner

Primary Examiner—Randy Gulakowski
Assistant Examiner—Gentle Winter
(74) Attorney, Agent, or Firm—Tung Associates

(57) ABSTRACT

A method for cleaning a silicon-based substrate in an ammonia-containing solution without incurring any damages to the silicon surface by NH₄OH vapor is described. The method can be conducted by first providing a silicon-based substrate that has a silicon surface, then forming a silicon oxide layer of very small thickness, i.e. less than 10 Å, on the silicon surface. The silicon-based substrate can then be cleaned in an ammonia-containing solution without incurring any surface damage to the silicon, i.e. such as the formation of silicon holes. The present invention novel method can be carried out by either adding an additional oxidation tank before the SC-1 cleaning tank, or adding an oxidant to a quick dump rinse tank prior to the SC-1 cleaning process.

11 Claims, 2 Drawing Sheets

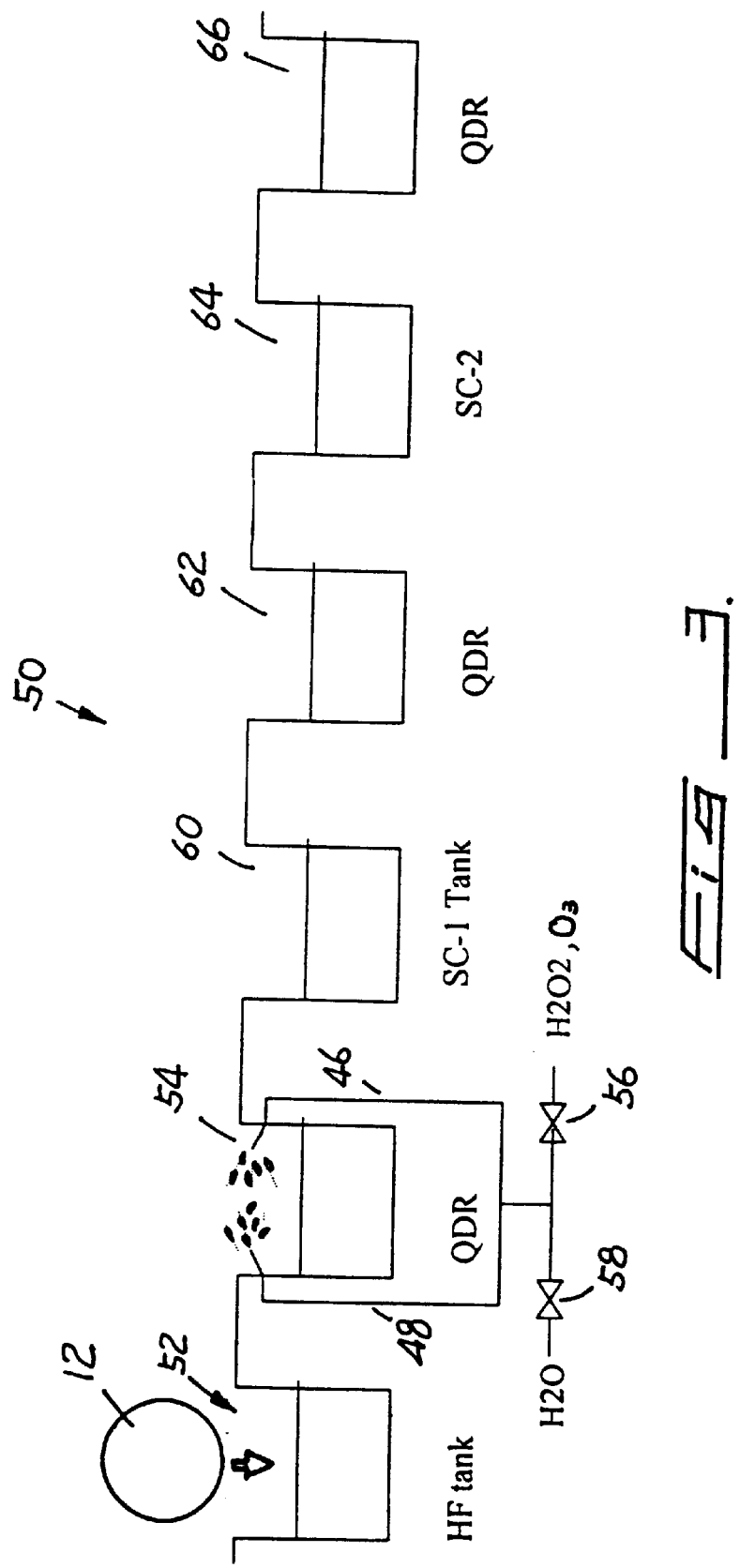
Fig_3.

METHOD FOR CLEANING A SILICON-BASED SUBSTRATE WITHOUT NH₄OH VAPOR DAMAGE

FIELD OF THE INVENTION

The present invention generally relates to a method for cleaning a silicon-based substrate in an ammonia-containing solution and more particularly, relates to a method for cleaning a silicon wafer in a cleaning solution containing ammonia without incurring ammonia vapor damages to the silicon surface of the wafer.

BACKGROUND OF THE INVENTION

In the manufacture of semiconductor devices, a large quantity of deionized (DI) water is required to process silicon wafers. The consumption of DI water increases with the size of the wafers. For instance, the consumption at least doubles in the processing of 200 mm size wafers when compared to the consumption in the processing of 150 mm size wafers. DI water is most frequently used in tanks and scrubbers for the frequent cleaning and rinsing of wafers in process. It is desirable that the surface of a wafer be cleaned by DI water after any process has been conducted on the wafer, i.e., oxide deposition, nitride deposition, SOG deposition or any other deposition or etching process. Such wafer cleaning step is accomplished by equipment that are installed either in-line or in a batch-type process.

For instance, a cassette-to-cassette wafer scrubbing system is one of the most used production systems for wafer cleaning prior to either a photoresist coating, oxidation, diffusion, metalization or CVD process. A typical automated wafer scrubber combines brush and solution scrubbing by DI water. The scrubber utilizes a hyperbolic high pressure spray of DI water with a retractable cleaning brush. A typical mechanical scrubbing process consists of rotating a brush near a wafer surface that is sprayed with a jet of high pressure DI water at a pressure between about 2,000 and about 3,000 psi. The brush does not actually contact the wafer surface, instead, an aquaplane is formed across the wafer surface which transfers momentum to the DI water. The movement of the DI water thus displaces and dislodges contaminating particles that have been deposited on the wafer surface. Contaminating particles are thus removed by a momentum transfer process. As a result, larger particles become more difficult to dislodge and remove from a wafer surface.

A typical wafer scrubbing process consists of a DI water spray step followed by a spin dry and nitrogen gas blow dry step. In a typical wafer scrubbing equipment, production rates are generally between 60 to 120 wafers per hour depending on the program length. The spinning speed of the wafer is between 500 to 10,000 rpm while under a water pressure of up to 6,000 psi.

In more recently developed wafer scrubbing systems, inline systems are used which provide high pressure DI water scrubbing only while eliminating the possibility of wafer contamination by overloaded brushes. The water pressure in these systems range between 3,000 to 6,000 psi which are ejected from a nozzle mounted on an oscillating head. The wafer is spun when the oscillating spray is directed onto the wafer surface. After the cleaning step, wafer is dried by a pure nitrogen gas purge to promote rapid drying. After the scrubbing operation, wafers can be loaded into an in-line dehydration baking system for thorough drying. Batch-type systems are also used with DI water for cleaning, rinsing and drying prior to many IC processes. The systems can be programmed wherein wafers are loaded in cassettes before each cycle. One disadvantage of the batch system is their inability to be integrated into part of an automated wafer processing line.

In the conventional DI water cleaning systems, the basic requirements for the DI water cleaning system are that it provides a continuous supply of ultra-clean water with very low ionic content. It is believed that ionic contaminants in water, such as sodium, iron or copper when deposited onto a wafer surface can cause device degradation or failure. It is therefore desirable to eliminate all such ionic content from a DI water supply prior to using the water for cleaning wafers. A conventional method of measuring the ionic content in DI water is by monitoring the water resistivity. A water resistivity of $18 \times 10^6$ Ohm-cm or higher indicates a low ionic content in the DI water. In a conventional water purifying system, several sections which include charcoal filters, electrodialysis units and a number of resin units to demineralize the water are used for purifying the water.

Deionized water is frequently used in a wet bench process after a metal etching process has been conducted on a semiconductor wafer. When residual etchant chemical must be removed, deionized water rinse is used in a wet bench process for semiconductor wafer processing to perform two major functions of a quick dump rinse (QDR) and a cascade overflow rinse. Conventionally, the two functions are carried out in separate tanks in order to produce the desirable result. One of the major processing issues presented by the conventional dual-tank process is the particle re-deposition problem during a withdrawal step when cassettes are transported from a quick dump rinse tank to a cascade overflow tank. A second major issue is the large floor space required for accommodating the two tanks.

A conventional wet bench wafer cleaning process is shown in FIG. 1. The wet bench wafer cleaning process 10 for cleaning wafer 12 is carried out in six separate cleaning and rinsing tanks sequentially of a HF cleaning tank 14, a first quick dump rinse (QDR) tank 16, a SC-1 cleaning tank 18, a second quick dump rinse tank 20, a SC-2 cleaning tank 22 and a third quick dump rinse tank 24. The first HF cleaning tank is used to hold a diluted HF solution, for instance, at a concentration of 0.5% HF in $H_2O$ for removing a thin native oxide layer from the wafer surface. After the diluted HF cleaning process, the wafer 12 is rinsed in a first quick dump rinse tank 16 with deionized water. Wafer 12 is then cleaned in a second cleaning tank filled with SC-1 cleaning solution, i.e. a mixture of $NH_4OH$, $H_2O_2$ and DI water at a ratio of 1:1:5. The SC-1 cleaning solution is used at a temperature between 70~80° C. for a suitable time period. The wafer 12 is then rinsed again in a second quick dump rinse tank 20 that is filled with DI water. In the final stage of cleaning, the wafer 12 is cleaned in tank 22 filled with a cleaning solution of SC-2 which is a mixture of HCl, $H_2O_2$ and DI water at a ratio of 1:1:5. The wafer 12 is then rinsed in a third quick dump rinse tank 24 with DI water.

The wet bench wafer cleaning process 10 shown in FIG. 1 is conventionally used for pre-diffusion clean, pre-gate oxidation clean, pre-CVD clean, etc. For instance, in the ULSI fabrication of integrated devices, the conventional wet bench wafer cleaning process 10 can be advantageously used for wafer surface cleaning before a coating process in a CVD chamber or an oxidation process in a furnace.

Despite the fact that the conventional wet bench wafer cleaning process 10 is widely used, serious processing disadvantages of the process has been observed. For instance, during the SC-1 cleaning process carried out in tank 18, since SC-1 contains about 28% $NH_4OH$ which tends to form $NH_4OH$ vapor in the tank cavity over the surface of the solution. When wafer 12 is removed from the SC-1 cleaning solution and taken out of tank 18, $NH_4OH$ vapor attacks the clean wafer surface, i.e. the fresh silicon surface of the wafer. As a consequence, a defect known as "silicon hole" frequently occurs wherein craters in the silicon surface are formed due to $NH_4OH$ vapor attack.

It is therefore an object of the present invention to provide a method for cleaning a silicon-based substrate in a wet bench cleaning process without the drawbacks or shortcomings of the conventional wet bench process.

It is another object of the present invention to provide a method for cleaning a silicon-based substrate in a wet bench cleaning process in which $NH_4OH$ vapor attack on the silicon surface is avoided.

It is a further object of the present invention to provide a method for cleaning a silicon-based substrate in a wet bench cleaning process in which an ammonia-containing solution is utilized without producing the silicon hole defect.

It is another further object of the present invention to provide a method for cleaning a silicon-based substrate in a wet bench cleaning process by first oxidizing the silicon surface before exposing the surface to an ammonia-containing cleaning solution.

It is still another object of the present invention to provide a method for cleaning a silicon-based substrate in a wet bench cleaning process by first exposing the silicon surface to an oxidant of $H_2O_2$ or $O_3$ before exposing to SC-1 cleaning solution.

It is yet another object of the present invention to provide a method for cleaning a silicon-based substrate in a wet bench cleaning process by first exposing the silicon surface to a quick dump rinse that contains an oxidant such that a thin layer of silicon oxide of less than 10 Å thickness is formed before exposing the substrate to other cleaning solutions.

It is still another further object of the present invention to provide an apparatus for cleaning a silicon-based substrate in an ammonia-containing solution that includes a first rinse tank filled with DI water, a second rinse tank containing an oxidant for forming a silicon oxide layer on the substrate, and a cleaning tank for cleaning the substrate in an ammonia-containing solution.

SUMMARY OF THE INVENTION

In accordance with the present invention, a method for cleaning a silicon-based substrate in an ammonia-containing solution without the formation of silicon hole defects, and an apparatus for cleaning a silicon-based substrate in an ammonia-containing solution without $NH_4OH$ vapor damage are provided.

In a preferred embodiment, a method for cleaning a silicon-based substrate in an ammonia-containing solution can be carried out by the operating steps of first providing a silicon-based substrate that has a silicon surface thereon; forming a silicon oxide layer on the silicon surface; and cleaning the silicon-based substrate in an ammonia-cleaning solution.

The method for cleaning a silicon-based substrate in an ammonia-containing solution may further include the step of forming the silicon oxide layer by exposing the silicon surface to an oxidant of $H_2O_2$ or $O_3$. The method may further include the step of forming the oxide layer to a thickness of not more than 10 Å, or the step of removing the silicon oxide from the silicon-based substrate after the ammonia-containing solution cleaning step. The method may further include the step of forming the silicon oxide by exposing the silicon surface to deionized water that contains an oxidant. The ammonia-containing solution may include $NH_4OH$. The method may further include the step of pre-cleaning the silicon surface in a pre-cleaning step utilizing HF.

The present invention is further directed to a method for cleaning a silicon-based substrate in an ammonia-containing solution which can be carried out by the operating steps of first providing a silicon-based substrate that has a silicon surface thereon; exposing the silicon surface to a quick dump rinse solution containing an oxidant; forming a silicon oxide layer on the silicon surface; and cleaning the silicon-based substrate in an ammonia-containing solution.

The method for cleaning a silicon-based substrate in an ammonia-containing solution may further include the step of forming the silicon oxide layer by exposing the silicon surface to a quick dump rinse solution containing $H_2O_2$ or $O_3$, or the step of forming the silicon oxide layer to a thickness not more than 10 Å. The method may further include the step of removing the silicon oxide layer after the cleaning step. The ammonia-containing solution may be a solution that includes $NH_4OH$. The method may further include the step of pre-cleaning the silicon surface in a pre-cleaning process utilizing diluted HF.

The present invention is further directed to an apparatus for cleaning a silicon-based substrate in an ammonia-containing solution which includes a first rinse tank for pre-rinsing a silicon-based substrate that has a silicon surface thereon; a second rinse tank containing an oxidant therein for forming a silicon oxide layer on the silicon surface; and a cleaning tank for cleaning the silicon-based substrate in an ammonia-containing solution.

The apparatus for cleaning a silicon-based substrate in an ammonia-containing solution may further include a cleaning tank that contains HF positioned after the ammonia-containing cleaning tank for removing the silicon oxide layer from the silicon-based substrate. The second rinse tank may contain a rinse solution that includes an oxidant of $H_2O_2$ or $O_3$. The silicon oxide layer may be formed to a thickness of not more than 10 Å. The ammonia-containing solution may include $NH_4OH$. The apparatus may further include a pre-cleaning tank that contains HF for pre-cleaning the silicon surface prior to the pre-rinsing step in the first rinse tank. The second rinse tank may be a quick dump rinse tank utilizing deionized water.

BRIEF DESCRIPTION OF THE DRAWINGS

These and other objects, features and advantages of the present invention will become apparent from the following detailed description and the appended drawings in which:

FIG. 3 is a graph illustrating another embodiment of the present invention wet bench wafer cleaning process in which an oxidant is added to a quick dump rinse tank for oxidizing the silicon surface prior to exposure to $NH_4OH$ vapor.

DETAILED DESCRIPTION OF THE PREFERRED AND ALTERNATE EMBODIMENTS

The present invention discloses a new process recipe for silicon-based material cleaning by adding an oxidant before $NH_4OH$ (which is contained in SC-1 recipe) base solution cleaning such that any $NH_4OH$ vapor damage to the silicon surface and the formation of silicon hole defect can be avoided.

In the fabrication of semiconductor devices or thin film transistor LCD devices, the standard SC-1 cleaning recipe which contains a high percentage of $NH_4OH$ in a base solution is frequently used for cleaning a silicon surface before any deposition or oxidation process. Since $NH_4OH$ vapor cumulates in a SC-1 cleaning tank (above the liquid level) which damages and corrodes a fresh silicon surface, defects such as silicon holes can be formed which leads to a low yield of the fabrication process.

The present invention method utilizes an oxidant, i.e. $H_2O_2$, $O_3$ or any other suitable oxidant, in a cleaning process before the $NH_4OH$ base solution cleaning. The additional oxidation process prevents $NH_4OH$ damage and corrosion by forming a very thin layer, i.e. less than 10 Å thickness, of silicon oxide on a fresh silicon surface. The oxidant of $H_2O_2$, $O_3$ or any other suitable oxidant causes the formation of chemical oxide on the surface of the silicon-based substrate to prevent $NH_4OH$ vapor damage and resulting corrosion of the silicon surface. The present invention method therefore improves a conventional wet bench wafer cleaning method for removing various contaminants such as native oxide films, metal ions, organic or polymeric residues on a wafer surface after various processing steps.

In the present invention method, a silicon-based substrate that has a silicon surface is first provided, a silicon oxide layer on the silicon surface is then formed by exposing the surface to an oxidant either in a separate treatment tank or in a quick dump rinse tank. The silicon-based substrate is then cleaned in a cleaning solution that contains $NH_4OH$ without suffering any damages. Prior to the silicon oxide growth step, the silicon-based substrate may first be cleaned in a diluted HF solution to ensure a fresh silicon surface. After the cleaning process by SC-1 (i.e. by the ammonia-containing solution), the residual silicon oxide thin film can be removed from the silicon-based substrate in a second HF cleaning process.

Figure 1:
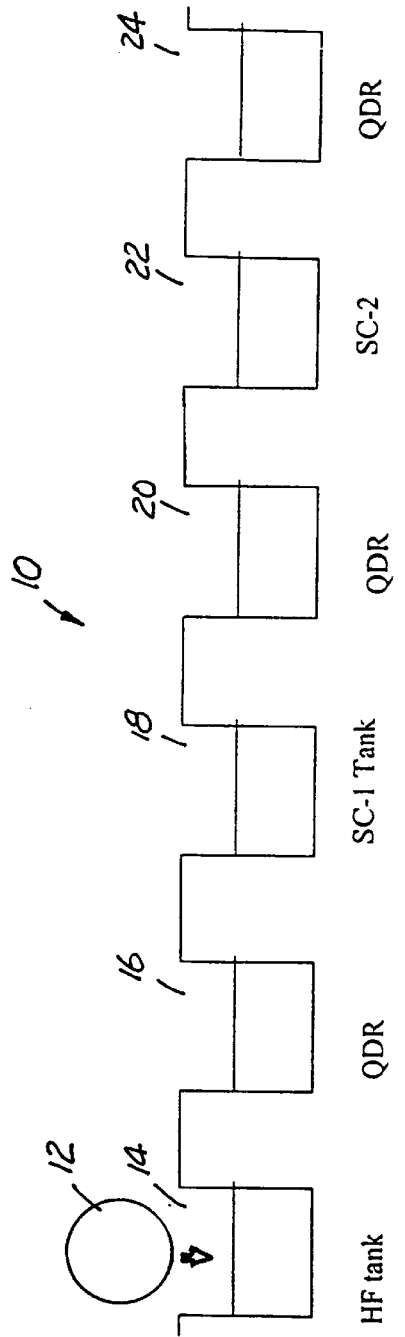
FIG. 1 is a graph illustrating a conventional wet bench wafer cleaning process utilizing SC-1 and SC-2 recipes.
Figure 2:
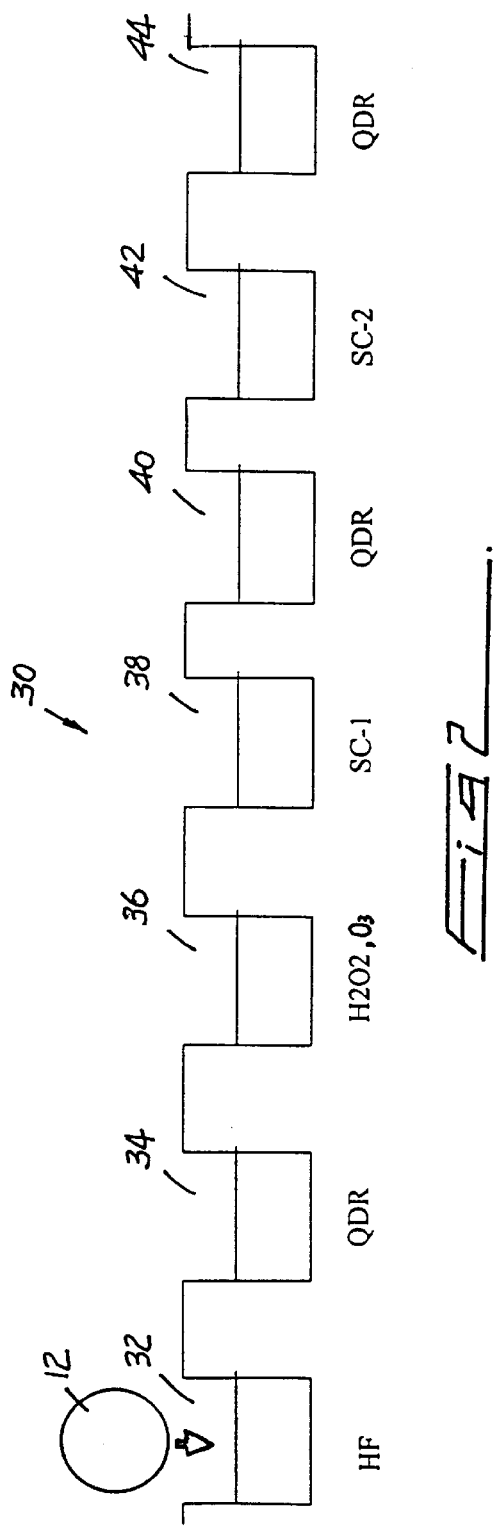
FIG. 2 is a graph illustrating the present invention wet bench wafer cleaning process utilizing an oxidant tank for oxidizing the wafer surface before it is exposed to $NH_4OH$ vapor.

Referring now to FIG. 2 wherein a present invention wet bench wafer cleaning process 30 is shown. In process 30, a wafer 12 is first dipped into a pre-cleaning tank 32 that contains a diluted HF solution. A suitable diluted solution contains about 0.5% HF in DI water. Other suitable pre-cleaning steps may also be utilized. After the HF acid cleaning step, the wafer 12 is dipped in a first quick dump rinse tank 34 to remove residual HF on the wafer surface.

The present invention method step for preventing $NH_4OH$ vapor damage to a silicon surface during a wet bench cleaning process is shown in FIG. 2 as step 36. The wafer 12 is positioned in tank 36 which contains DI water and an oxidant of $H_2O_2$, $O_3$ or any other suitable oxidant. A fresh silicon surface on wafer 12 is oxidized by the oxidant to form a thin layer of silicon oxide, in the range of 10 Å or less, and preferably not to exceed 10 Å. After a suitable thickness of silicon oxide is grown on the wafer surface, wafer 12 is dipped into a first cleaning tank that contains SC-1 cleaning solution and $NH_4OH$ vapor inside the tank above the liquid level. The $NH_4OH$ vapor attacks the silicon oxide layer which protects the silicon surface underneath from forming any defects such as silicon holes. After the first cleaning process is completed in SC-1 tank 38, wafer 12 is rinsed in a second quick dump rinse tank 40 to remove residual SC-1 solution left on the wafer.

The wafer 12 is then moved to a second cleaning tank that contains SC-2 cleaning solution of acid base, i.e. one that contains 36 vol. % HCl. The temperature of the SC-2 solution is normally kept at between 70° C. and 80° C. The time required for cleaning in the SC-2 solution is similar to that required in the SC-1 solution, i.e. for about 10~15 min. After the SC-2 cleaning is completed, the wafer 12 is moved to the third quick dump rinse tank 44 for removing any residual SC-2 solution by DI water.

In an alternate embodiment, the present invention novel method for forming a silicon oxide layer on a fresh silicon surface before exposing to corrosive $NH_4OH$ vapor is shown in FIG. 3. In this alternate embodiment, a separate oxidation tank is not required. This is made possible by utilizing a specially designed quick dump rinse tank 54 in which an oxidant is sprayed or otherwise added to the DI water in the quick dump rinse tank. In the alternate process 50 shown in FIG. 3, wafer 12 is first pre-cleaned in a diluted HF tank 52 for removing most surface contaminants. Wafer 12 is then rinsed off in the first quick dump rinse tank 54. The first quick dump rinse tank 54 is equipped with fluid conduits 46,48 for feeding into the quick dump rinse tank 54 through valves 56,58, respectively, a solution of $H_2O_2$ or $O_3$ and $H_2O$. It should be noted that in this alternate embodiment, the use of a separate oxidation tank such as that shown in FIG. 2 is not necessary and thus, resulting in equipment cost savings.

After the first quick dump rinse tank 54 rinsing procedure is completed, wafer 12 is cleaned in the SC-1 cleaning tank 60 for removing contaminants and impurities from the wafer surface. The wafer 12 is then rinsed in the second quick dump rinse tank 62 to remove any residual SC-1 cleaning solution from the wafer surface.

In the next step of the process, wafer 12 is soaked in the SC-2 cleaning tank which contains about 36 vol. % HCl, and then rinsed in a third quick dump rinse tank 66 to remove any residual SC-2 cleaning solution from the wafer surface. This is shown in FIG. 3.

It should be noted that while not shown in FIGS. 2 and 3, a final cleaning process for removing any residual silicon oxide thin film can be carried out in a diluted HF cleaning tank. Since a silicon oxide film formed by the present invention novel method is very thin, usually in the range between about 3 Å and about 5 Å, or in any event not thicker than 10 Å, the SC-1 cleaning process (i.e. $NH_4OH$ vapor present in the SC-1 tank) effectively removes most of the silicon oxide film without damaging the silicon surface underneath. The final cleaning process by diluted HF thus may not be necessary. The thin layer of silicon oxide formed by the present invention novel method effectively prevents any etching of the silicon surface by $NH_4OH$ vapor and thus, ensuring the integrity of the silicon-based substrate through the wet bench cleaning process.

The present invention novel method for cleaning a silicon-based substrate in an ammonia-containing solution without incurring any damages to the silicon surface has therefore been amply described in the above description and in the appended drawings of FIGS. 2 and 3.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for cleaning a silicon-based substrate in an ammonia-containing solution comprising the steps of;
   providing a silicon-based substrate having a silicon surface thereon;
   forming a silicon oxide layer to a thickness between 3 Å and 10 Å on said silicon surface; and
   cleaning said silicon-based substrate in an ammonia-containing solution.

2. A method for cleaning a silicon-based substrate in an ammonia-containing solution according to claim 1 further comprising the step of forming said silicon oxide layer by exposing said silicon surface to an oxidant of $H_2O_2$ or $O_3$.

3. A method for cleaning a silicon-based substrate in an ammonia-containing solution according to claim 1 further comprising the step of removing said silicon oxide from said silicon-based substrate after said ammonia-containing solution cleaning step.

4. A method for cleaning a silicon-based substrate in an ammonia-containing solution according to claim 1 further comprising the step of forming said silicon oxide by exposing said silicon surface to deionized water that contains an oxidant.

5. A method for cleaning a silicon-based substrate in an ammonia-containing solution according to claim 1, wherein said ammonia containing solution comprises $NH_4OH$.

6. A method for cleaning a silicon-based substrate in an ammonia-containing solution according to claim 1 further comprising the step of pre-cleaning said silicon surface in a pre-cleaning step utilizing HF.

7. A method for cleaning a silicon-based substrate in an ammonia-containing solution comprising the steps of:
   providing a silicon-based substrate having a silicon surface thereon;
   exposing said silicon surface to a quick dump rinse solution containing an oxidant;
   forming a silicon oxide layer to a thickness between 3 Å and 10 Å on said silicon surface; and
   cleaning said silicon-based substrate in an ammonia-containing solution.

8. A method for cleaning a silicon-based substrate in an ammonia-containing solution according to claim 7 further comprising the step of forming said silicon oxide layer by exposing said silicon surface to a quick dump rinse solution containing $H_2O_2$ or $O_3$.

9. A method for cleaning a silicon-based substrate in an ammonia-containing solution according to claim 7 further comprising the step of removing said silicon oxide layer after said cleaning step.

10. A method for cleaning a silicon-based substrate in an ammonia-containing solution according to claim 7, wherein said ammonia containing solution comprises $NH_4OH$.

11. A method for cleaning a silicon-based substrate in an ammonia containing solution according to claim 7 further comprising the step of pre-cleaning said silicon surface in a pre-cleaning step utilizing HF.

* * * * *